United States Patent
Sun

(10) Patent No.: US 12,100,129 B2
(45) Date of Patent: Sep. 24, 2024

(54) PRINTING SOLDER POINT QUALITY IDENTIFICATION AND MAINTENANCE SUGGESTION SYSTEM AND METHOD THEREOF

(71) Applicants: Inventec (Pudong) Technology Corporation, Shanghai (CN); Inventec Corporation, Taipei (TW)

(72) Inventor: Meng Sun, Shanghai (CN)

(73) Assignees: Inventec (Pudong) Technology Corporation, Shanghai (CN); Inventec Corporation, Taipei (TW)

(*) Notice: Subject to any disclaimer, the term of this patent is extended or adjusted under 35 U.S.C. 154(b) by 442 days.

(21) Appl. No.: 17/357,396

(22) Filed: Jun. 24, 2021

(65) Prior Publication Data

US 2022/0398714 A1    Dec. 15, 2022

(30) Foreign Application Priority Data

Jun. 15, 2021    (CN) .......................... 202110660686.7

(51) Int. Cl.
*G06T 7/00* (2017.01)
*B23K 31/12* (2006.01)
*G01N 21/956* (2006.01)

(52) U.S. Cl.
CPC ............ *G06T 7/0004* (2013.01); *B23K 31/12* (2013.01); *G01N 21/95607* (2013.01); *G01N 2021/95646* (2013.01); *G06T 2207/30152* (2013.01)

(58) Field of Classification Search
CPC ......... G06T 7/0004; G06T 2207/30152; G06T 2207/30141; B23K 31/12; B23K 3/08; B23K 31/125; B23K 1/20; G01N 21/95607; G01N 2021/95646; G01N 21/01; G01N 21/956; G01N 2021/0112; H05K 13/083;
(Continued)

(56) References Cited

U.S. PATENT DOCUMENTS

2023/0059410 A1*    2/2023   Llinas ................... G01B 15/00

FOREIGN PATENT DOCUMENTS

| CN | 105057838 A | * | 11/2015 | ............... B23K 3/00 |
| KR | 20200038127 A | * | 4/2020 | ............... G06T 7/90 |
| TW | I741894 B | * | 10/2021 | ........... G01N 21/967 |

* cited by examiner

*Primary Examiner* — Hwa Andrew Lee
(74) *Attorney, Agent, or Firm* — David R. Stevens; Stevens Law Group

(57) ABSTRACT

A printing solder point quality identification and maintenance suggestion system and a method thereof are disclosed. In the system, when solder paste inspection data, component inspection data or circuit inspection data indicates presence of defect, an analysis and calculation device intercepts the operating data, the equipment data, the raw material data, the process data and the environment data from a time data stream, to generate a data feature portrait. The analysis and calculation device then sets a reliability value based on location association between the solder paste inspection data, the component inspection data, the circuit inspection data and the maintenance data in the location data stream, and performs similarity calculation on the data feature portrait and the comparison data feature portrait to calculate a similarity value, and then calculates a relative reliability value, and compares the relative reliability value with a reliability threshold value to generate maintenance suggestion information.

3 Claims, 4 Drawing Sheets

(58) Field of Classification Search
CPC ........ G01B 11/06; G01K 13/00; G06Q 10/20; G06Q 50/04
See application file for complete search history.

PRINTING SOLDER POINT QUALITY IDENTIFICATION AND MAINTENANCE SUGGESTION SYSTEM AND METHOD THEREOF

BACKGROUND OF THE INVENTION

1. Cross-Reference To Related Application

This application claims the benefit of Chinese Application Serial No. 202110660686.7, filed Jun. 15, 2021, which is hereby incorporated herein by reference in its entirety.

2. Field of the Invention

The present invention is related to a quality identification and maintenance suggestion system and a method thereof, and more particularly to a printing solder point quality identification and maintenance suggestion system which is able to associate and integrates data into a time data stream and a location data stream for analysis and calculation to generate maintenance suggestion information, and a method thereof.

3. Description of the Related Art

In the surface mount technology (SMT), a solder paste printing machine is a key production point in the circuit board manufacturing process, and the solder paste printing process largely determines the quality of the surface mount technology. Therefore, the general circuit board manufacturing process includes using a solder paste inspection to inspect the quality of solder paste printing.

The solder paste inspection performs inspection determination based on a threshold for a physical shape of the solder point or based on a change trend of solder point area, volume and height through the statistical method for statistical process control (SPC). However, the quality of the solder paste printing is not completely equal to the quality of the actual circuit connectivity, so when a printing quality problem occurs, the connectivity quality problem of an electronic component on actual circuit board may not occur. Therefore, the determination for the quality of the solder paste printing in actual production has high arbitrariness.

The conventional inspection determination method for the quality of solder paste printing quality is to use a simple threshold for determination hut it may report too many detects, so maintenance staff is hard to perform targeted processing and accurately describe the on-site data for further reference; Even if the solder paste inspection can provide equipment data, the equipment data is provided with a large amount of invalid and distorted data, so the equipment data has limited help in tracing the root causes of the problems and is not very representative for describing real problems in measured data of printing quality; furthermore, the conventional inspection determination method lacks guiding information for on-site investigation and improvement.

According to above-mentioned contents, what is needed is to develop an improved technical solution to solve the above-mentioned conventional technology problem of not easy to perform printing solder point quality identification and lacking targeted maintenance suggestions.

SUMMARY OF THE INVENTION

In order to solve the above-mentioned conventional technology problem of not easy to perform printing solder point quality identification and lacking targeted maintenance suggestions, the present invention discloses a printing solder point quality identification and maintenance suggestion system and a method thereof, the printing solder point quality identification and maintenance suggestion system of the present invention is adapted to an analysis and calculation device and includes a data receiving module, a data integration module, a location mapping module, a data acquisition module, a data feature portrait module, a reliability setting module, a calculation module and a generation module. The data receiving module is configured to receive operating data, equipment data, raw material data, process data and environment data from a solder paste printing workstation, receive solder paste inspection data from a solder paste inspection, receive component inspection data from an automated optical inspection, receive circuit inspection data from an in-line circuit inspection, and receive maintenance data in correspondence to the solder paste inspection data, the component inspection data and the circuit inspection data, from a maintenance workstation machine. The data integration module is configured to associate and integrate the operating data, the equipment data, the raw material data, the process data and the environment data into a time data stream, based on time. The location mapping module is configured to associate and integrate the solder paste inspection data, the component inspection data, the circuit inspection data and the maintenance data into a location data stream, based on a pin location of an electronic component. When the solder paste inspection data, the component inspection data or the circuit inspection data indicate defect, the data acquisition module intercepts the operating data, the equipment data, the raw material data, the process data and the environment data in correspondence to the manufacturing time of the pin location of the electronic component, from the time data stream. The data feature portrait module is configured to perform data projection on the intercepted operating data, the intercepted equipment data, the intercepted raw material data, the intercepted process data and the intercepted environment data, to generate a data feature portrait. The reliability setting module is configured to set a reliability value based on a location association between the solder paste inspection data, the component inspection data, the circuit inspection data and the maintenance data in the location data stream. The calculation module is configured to perform similarity calculation on the data feature portrait and the comparison data feature portrait to calculate a similarity value, and calculate a relative reliability value equal to a reliability value of the comparison data feature portrait times the similarity value plus a reliability value of the data feature portrait. The generation module is configured to compare the relative reliability value and a reliability threshold value, so as to generate a maintenance suggestion information based on a comparison result.

According to an embodiment, the present invention provides a printing solder point quality identification and maintenance suggestion method including following steps: using an analysis and calculation device to receive operating data and equipment data, raw material data, process data, and environment data from a solder paste printing workstation; using the analysis and calculation device to receive solder paste inspection data from a solder paste inspection; using the analysis and calculation device to receive component inspection data from an automated optical inspection; using the analysis and calculation device to receive circuit inspection data from an in-line circuit inspection; using the analysis and calculation device to receive maintenance data in correspondence to the solder paste inspection data, the component inspection data and the circuit inspection data, from a maintenance workstation; using the analysis and calculation device to associate and integrate the operating data, the equipment data, the raw material data, the process data and the environment data into a time data stream, based on time; using the analysis and calculation device to associate and integrate the solder paste inspection data, the component inspection data, the circuit inspection data and the maintenance data into a location data stream, based on a pin location of an electronic component; when the solder paste inspection data, the component inspection data or the circuit inspection data indicates presence of defect, using the analysis and calculation device to intercept the operating data, the equipment data, the raw material data, the process data and the environment data in correspondence to a manufacturing time of a pin location of the electronic component, from the time data stream; using the analysis and calculation device to perform data projection on the intercepted operating data, the intercepted equipment data, the intercepted raw material data, the intercepted process data and the intercepted environment data, so as to generate a data feature portrait; using the analysis and calculation device to set a reliability value based on location association between the solder paste inspection data, the component inspection data, the circuit inspection data and the maintenance data in the location data stream; using the analysis and calculation device to perform similarity calculation on the data feature portrait and a comparison data feature portrait to calculate a similarity value, and then calculate a relative reliability value equal to the reliability value of the comparison data feature portrait times the similarity value plus the reliability value of the data feature portrait; using the analysis and calculation device to compare the relative reliability value with a reliability threshold value, so as to generate maintenance suggestion information based on a comparison result.

According to the above-mentioned system and method of the present invention, the difference between the present invention and the conventional technology is that, in the present invention, when the solder paste inspection data, the component inspection data or the circuit inspection data indicates presence of defect, the analysis and calculation device intercepts the operating data, the equipment data, the raw material data; the process data and the environment data in correspondence to the manufacturing time of the pin location of the electronic component from the time data stream, so as to generate the data feature portrait, and the analysis and calculation device then sets the reliability value based on the location association between the solder paste inspection data, the component inspection data, the circuit inspection data and the maintenance data in the location data stream; the analysis and calculation device then performs similarity calculation on the data feature portrait and the comparison data feature portrait to calculate the similarity value, and then calculate the relative reliability value equal to the reliability value of the comparison data feature portrait times the similarity value plus the reliability value of the data feature portrait; the analysis and calculation device then compares the relative reliability value with the reliability threshold value, so as to generate the maintenance suggestion information based on a comparison result.

According to the above-mentioned technical solution; the present invention is able to achieve the technical effect of providing accurate printing solder point quality identification and maintenance suggestion.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
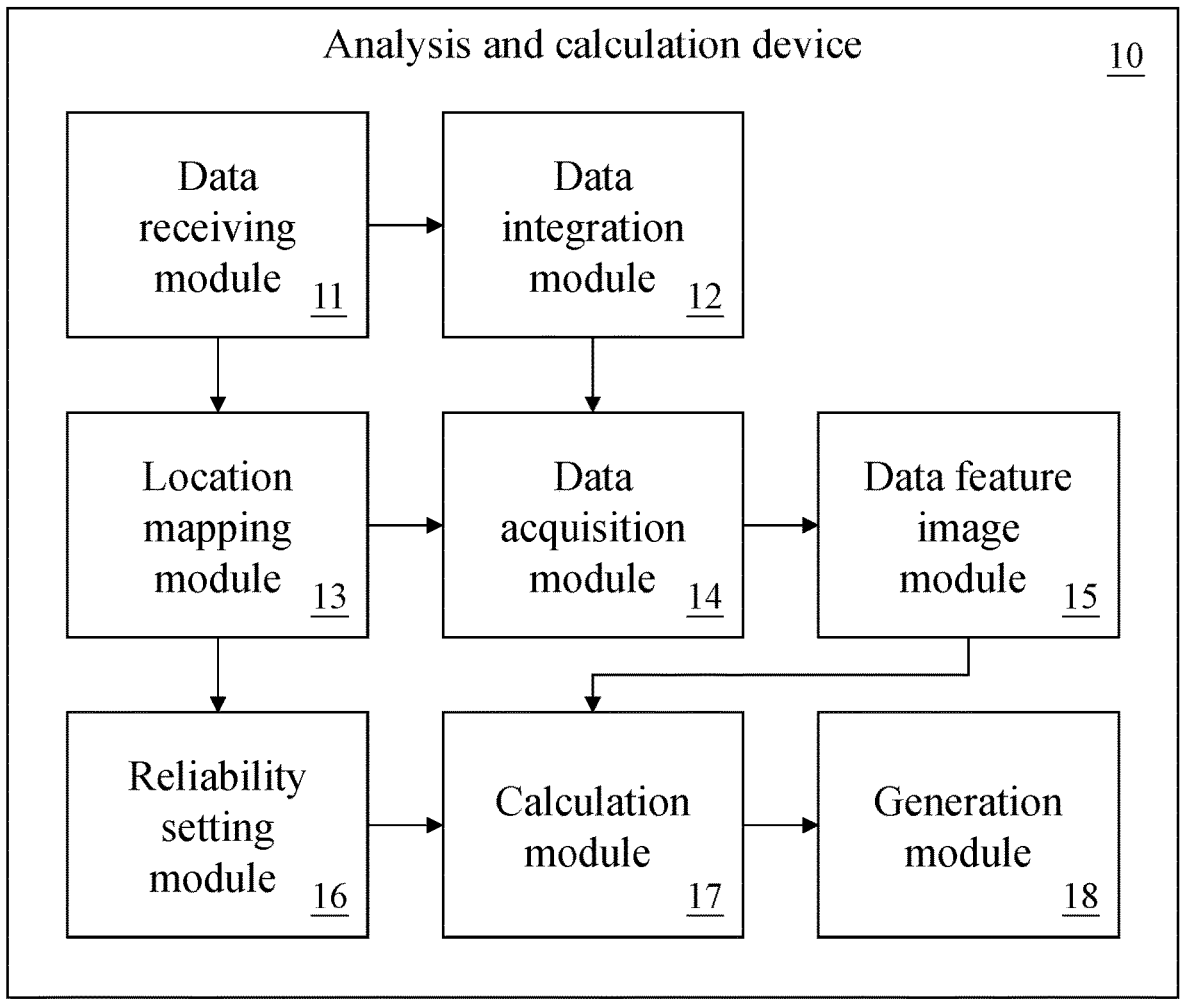
FIG. 1 is a system block diagram of a printing solder point quality identification and maintenance suggestion system of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

The printing solder point quality identification and maintenance suggestion system of the present invention will be described in the following paragraphs. Please refer to FIG. 1, which is a system block diagram of a printing solder point quality identification and maintenance suggestion system of the present invention.

The printing solder point quality identification and maintenance suggestion system of the present invention can be adapted to an analysis and calculation device 10, and includes a data receiving module 11, a data integration module 12, a location mapping module 13, a data acquisition module 14, a data feature portrait module 15, a reliability setting module 16, a calculation module 17 and a generation module 18.

In an embodiment, the analysis and calculation device 10 can be a computer or a server; the analysis and calculation device 10 can be in communication with a solder paste punting workstation, a solder paste inspection, an automated optical inspection, an in-line circuit inspection and a maintenance workstation through a wired transmission manner or a wireless transmission manner; for example, the wired transmission manner can be a cable network, and an optical network and so on; and the wireless transmission manner can be Wi-Fi, or mobile communication network such as 3G, 4G, 5G and so on; however, these examples are merely for exemplary illustration, and the application field of the present invention not limited thereto.

The data receiving module 11 of the analysis and calculation device 10 receives operating data, equipment data, raw material data, process data and environment data from a solder paste printing workstation.

The aforementioned operating data can be, for example, an operator's operation on the solder paste printing workstation, the operator's basic information (such as employee name or employee number), operator's advance information (such as employee skills, employee entry time or employee departure time); however, these examples are merely for exemplary illustration, and the application field of the present invention is not limited to these examples.

In an embodiment, the aforementioned equipment data can be, for example, bracket positioning information, stress value, scraper pressure, de molding speed, steel screen inspection data, steel screen scraper maintenance; however, these examples are merely for exemplary illustration, and the application field of the present invention is not limited to these examples.

In an embodiment, the aforementioned raw material data can be, for example, PCB thickness, green paint inspection thickness, measured temperature, batch number, solder paste temperature, temperature recovery time, or mixing time; however, these examples are merely for exemplary illustration, and the application field of the present invention is not limited to these examples.

In an embodiment, the aforementioned process data can be, for example, equipment parameters used in the solder paste printing workstation, or the processing time of each step in the manufacturing process; however, these examples are merely for exemplary illustration, and the application field of the present invention is not limited to these examples.

In an embodiment, the aforementioned environment data can be, for example, production environment temperature, humidity, or electrostatic discharge (ESD); however, these examples are merely for exemplary illustration, and the application field of the present invention is not limited to these examples.

The data receiving module 11 of the analysis and calculation device 10 can receive the solder paste inspection data from a solder paste inspection, receive the component inspection data from an automated optical inspection, receive the circuit inspection data from an in-line circuit inspection, and receive maintenance data in correspondence to the solder paste inspection data, the component inspection data and the circuit inspection data from a maintenance workstation machine.

Next, the data integration module 12 of the analysis and calculation device 10 associates and integrates the operating data, the equipment data, the raw material data, and the process data, and the environment data into a time data stream based on time; that is, the data integration module 12 of the analysis and calculation device 10 finds the corresponding data, based on a selected time point or time range, from the operating data, the equipment data, the raw material data, the process data and the environment data, so that the data integration module 12 of the analysis and calculation device 10 determines the correspondence between the found data and the selected time point or the nine range, to associate and integrate the found data to generate the time data stream.

Next, the location mapping module 13 of the analysis and calculation device 10 associates and integrates the solder paste inspection data, the component inspection data, the circuit inspection data and the maintenance data into a location data stream, based on a pin location of an electronic component; that is, the location mapping module 13 of the analysis and calculation device 10 maps a solder point location of the solder paste inspection data to a location of an electronic component of the component inspection data, and maps the location of the electronic component of the component inspection data to a pin location of the electronic component in the circuit inspection data and the maintenance data, so as to generate the location data stream.

When the solder paste inspection data, the component inspection data or the circuit inspection data indicate presence of detect, the data acquisition module 14 of the analysis and calculation device 10 intercepts the operating data, the equipment data, the raw material data, the process data and the environment data in correspondence to a manufacturing time of the pin location of the electronic component from the time data stream.

Figure 2:
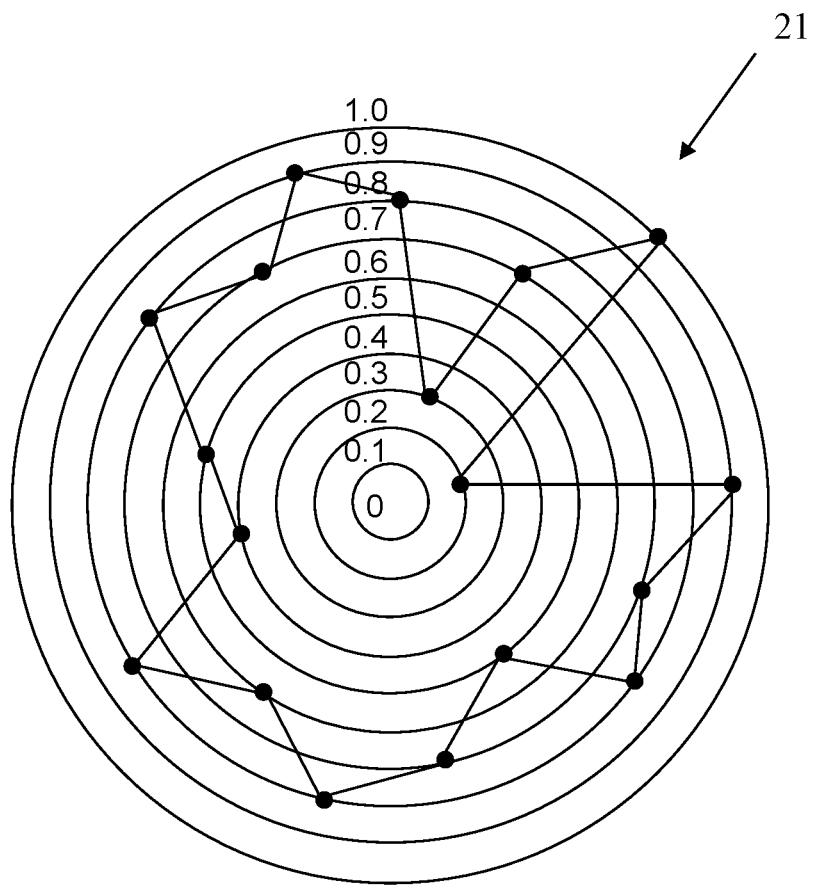
FIG. 2 is a schematic view of a data feature portrait of a printing solder point quality identification and maintenance suggestion system of the present invention.

After the data acquisition module 14 of the analysis and calculation device 10 intercepts the operating data, the equipment data, the raw material data, the process data and the environment data in correspondence to the manufacturing time of pin location of the electronic component from the time data stream, the data feature portrait module 15 of the analysis and calculation device 10 performs data projection (that is, normalization) on the intercepted operating data, the intercepted equipment data, the intercepted raw material data, the intercepted process data and the intercepted environment data, to generate a data feature portrait 21. The data feature portrait 21 is formed by performing data projection (that is, normalization) on data of item contents of the intercepted operating data, the intercepted equipment data, the intercepted raw material data, the intercepted process data and the intercepted environment data to convert the above-mentioned data into a range of 0 to 1. For example, in order to implement the data projection (that is, normalization), the data of item contents can be converted into the range of 0 to 1 based on a prebuilt conversion table or based on a prebuilt conversion formula; however, these examples are merely for exemplary illustration, and the application field of the present invention is not limited to these examples. The item contents are distributed in a circle with a radius of 1, and multiple pieces of the converted data of the item contents are connected in a sequential order to form the data feature portrait 21, as shown in FIG. 2, which is a schematic view of the data feature portrait of the printing solder point quality identification and maintenance suggestion system of the present invention.

The reliability setting module 16 of the analysis and calculation device 10 sets a reliability value based on location association between the solder paste inspection data, the component inspection data, the circuit inspection data and the maintenance data in the location data stream.

Particularly, when the solder paste inspection data indicates presence of defect, the reliability setting module 16 of the analysis and calculation device 10 sets the reliability value as a first reliability value, such as 0.5; when the solder paste inspection data indicates presence of defect, and the location of the electronic component mapping to the component inspection data also indicates presence of defect, the reliability setting module 16 of the analysis and calculation device 10 sets the reliability value as a second reliability value, such as 0.7; when the solder paste inspection data indicates presence of defect and the pin location of the electronic component mapping to the circuit inspection data also indicates presence of defect, the reliability setting module 16 of the analysis and calculation device 10 sets the reliability value as a third reliability value, such as when the solder paste inspection data indicates presence of defect and the location of the electronic component mapping to the component inspection data also indicates presence of defect and the pin location of the electronic component mapping to the circuit inspection data also indicates presence of defect; the reliability setting module 16 of the analysis and calculation device 10 sets the reliability value as a fourth reliability value, such as 0.9; when the solder paste inspection data indicates presence of defect and the location of the electronic component mapping to the component inspection data also indicates presence of defect and the pin location of the electronic component mapping to the circuit inspection data also indicates presence of defect and the pin location of the electronic component mapping to the maintenance data also indicates presence of defect, the reliability setting module 16 of the analysis and calculation device 10 sets the reliability value as a fifth reliability value, such as 1. However, these examples are merely for exemplary illustration, and the application field of the present invention is not limited to these examples.

Next, the calculation module 17 of the analysis and calculation device 10 performs similarity calculation on the data feature portrait 21 and a comparison data feature portrait to calculate a similarity value. For example, the comparison data feature portrait can be generated through aforementioned process in advance. Next, the calculation module 17 of the analysis and calculation device 10 calculate a relative reliability value equal to a reliability value of the comparison data feature portrait times the similarity value plus a reliability value of the data feature portrait. It should be noted that the similarity value is in a range of 0 to 1. These examples are merely for exemplary illustration, and the application field of the present invention is not limited to these examples.

In an embodiment, the calculation module 17 of the analysis and calculation device 10 can perform similarity calculation on the data feature portrait 21 and the comparison data feature portrait to calculate the similarity value by calculating differences between data points in the data feature portrait and corresponding data points in the comparison data feature portrait, respectively, and multiplying the differences by corresponding weight values to obtain weighted differences, and then calculating an average of the weighted differences to obtain the similarity value. In an embodiment, the weight values in correspondence to the data points (such as the item contents of each of the operating data, the equipment data, the raw material data, the process data and the environment data) can be determined by root cause analysis and statistics result of the item contents, and the weight values in correspondence to the data points may have the same parts or be totally different from each other. These examples are merely for exemplary illustration, and the application field of the present invention is not limited to these examples.

The generation module 18 of the analysis and calculation device 10 compares the relative reliability value with a reliability threshold value, so as to generate maintenance suggestion information based on a comparison result. Particularly, when the relative reliability value is higher than the reliability threshold value, the generation module 18 of the analysis and calculation device 10 can generate maintenance suggestion information according to the root cause and the corrective action in correspondence to the comparison data feature portrait, so that the maintenance staff can perform preliminary maintenance according to the maintenance suggestion information, thereby preventing the problem of high time consumption in maintenance.

Figure 3A:
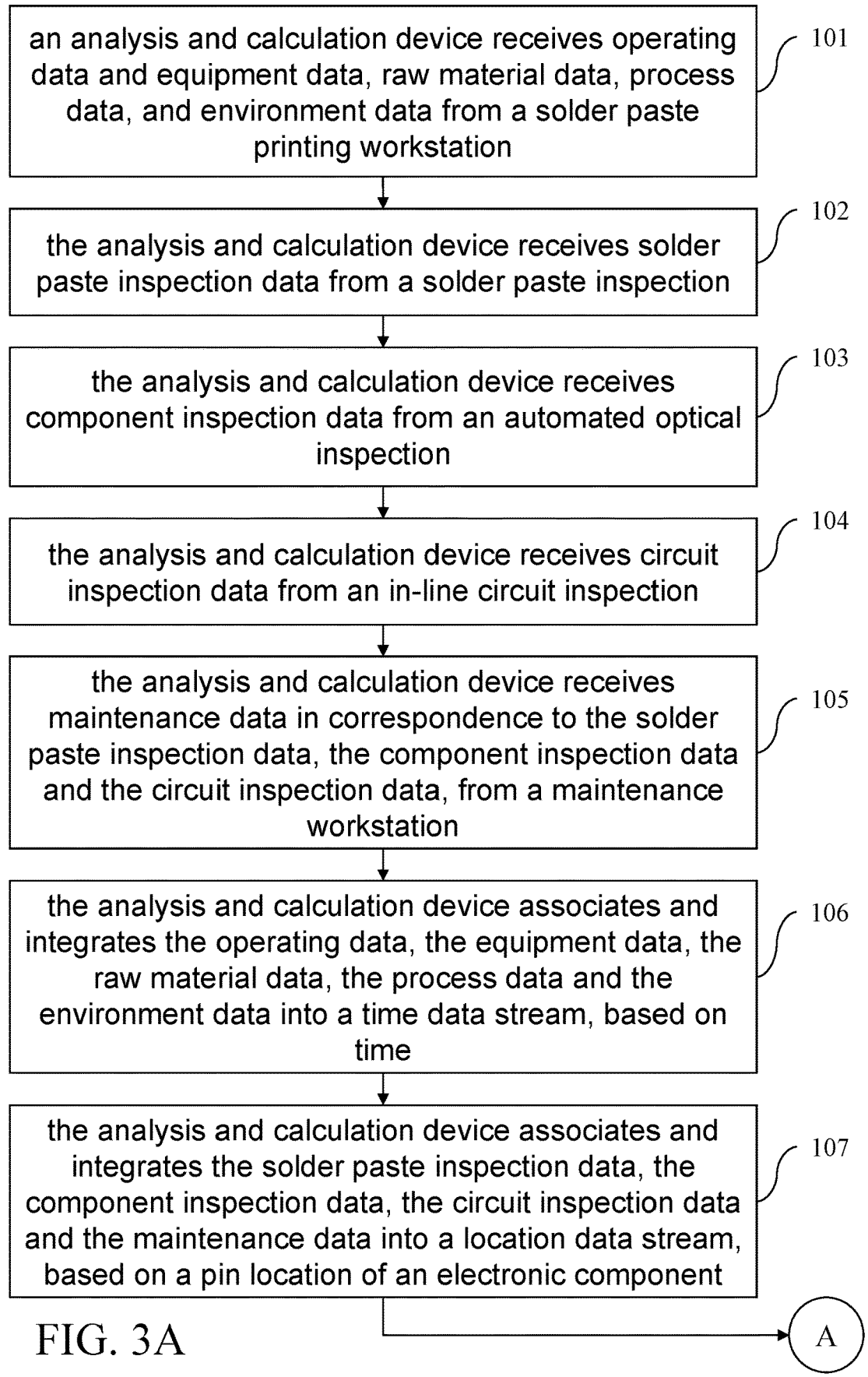
FIGS. 3A and 3B are flowcharts of a printing solder point quality identification and maintenance suggestion method of the present invention.
Figure 3B:
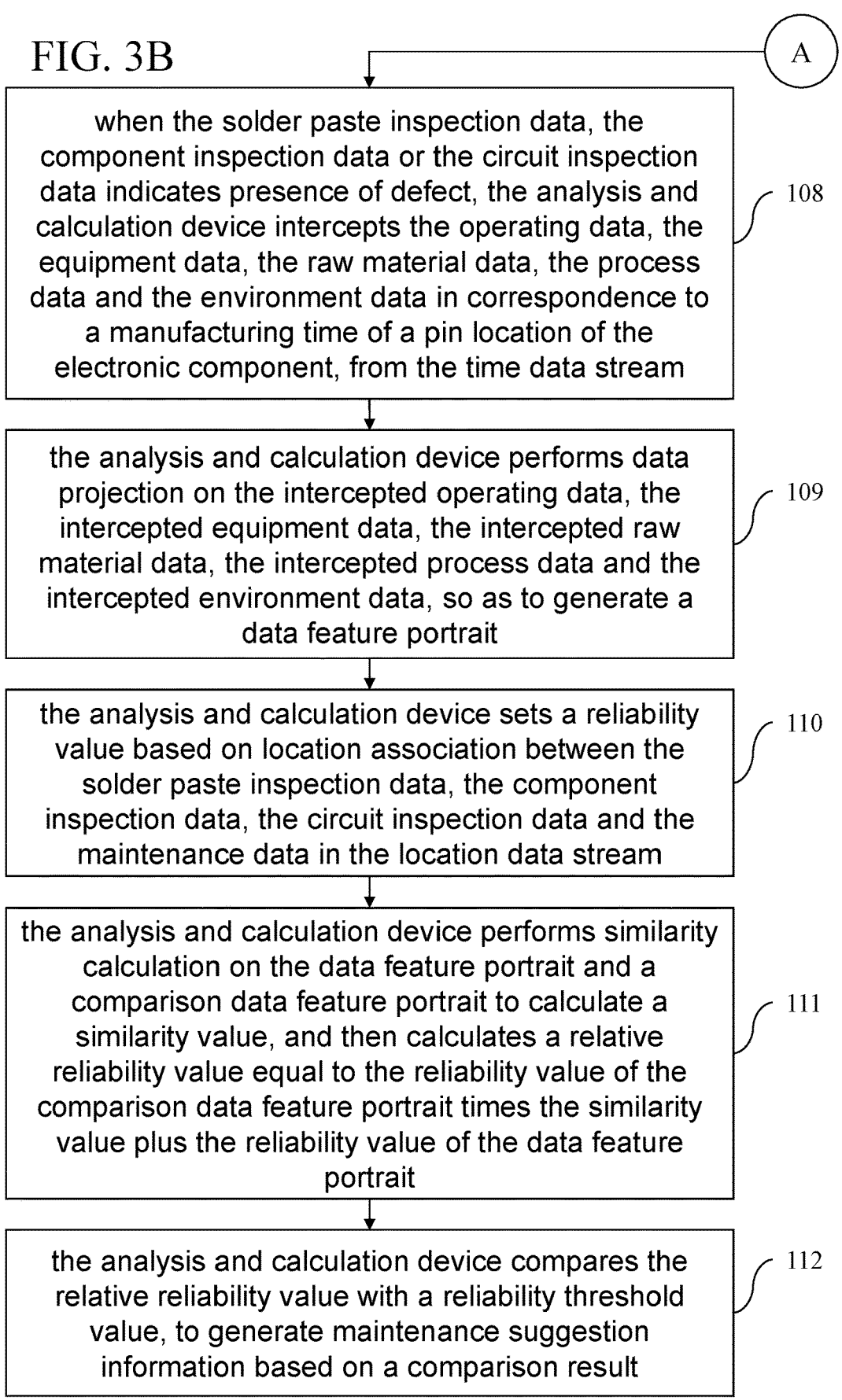

The operational method of the present invention will be described in the following paragraphs with reference to FIGS. 3A and 3B. FIG. 3A and FIG. 3B are a flowchart of a printing solder point quality identification and maintenance suggestion method of the present invention.

First of all, in a step 101, an analysis and calculation device receives operating data and equipment data, raw material data, process data, and environment data from a solder paste printing workstation. In a step 102, the analysis and calculation device receives solder paste inspection data from a solder paste inspection. Next, in a step 103, the analysis and calculation device receives component inspection data from an automated optical inspection. In a step 104, the analysis and calculation device receives circuit inspection data from an in-line circuit inspection. Next, in a step 105, the analysis and calculation device receives maintenance data in correspondence to the solder paste inspection data, the component inspection data and the circuit inspection data, from a maintenance workstation. Next, in a step 106, the analysis and calculation device associates and integrates the operating data, the equipment data, the raw material data, the process data and the environment data into a time data stream, based on time. In a step 107, the analysis and calculation device associates and integrates the solder paste inspection data, the component inspection data, the circuit inspection data and the maintenance data into a location data stream, based on a pin location of an electronic component. In a step 108, when the solder paste inspection data, the component inspection data or the circuit inspection data indicates presence of defect, the analysis and calculation device intercepts the operating data, the equipment data, the raw material data, the process data and the environment data in correspondence to a manufacturing time of a pin location of the electronic component, from the time data stream. In a step 109, the analysis and calculation device performs data projection on the intercepted operating data, the intercepted equipment data, the intercepted raw material data, the intercepted process data and the intercepted environment data, so as to generate a data feature portrait. In a step 110, the analysis and calculation device sets a reliability value based on location association between the solder paste inspection data, the component inspection data, the circuit inspection data and the maintenance data in the location data stream. Next, in a step 111, the analysis and calculation device performs similarity calculation on the data feature portrait and a comparison data feature portrait to calculate a similarity value, and then calculates a relative reliability value equal to the reliability value of the comparison data feature portrait times the similarity value plus the reliability value of the data feature portrait. In a step 112, the analysis and calculation device compares the relative reliability value with a reliability threshold value, so as to generate maintenance suggestion information based on a comparison result.

According to above-mentioned contents, the difference between the present invention and conventional technology is that, in the present invention, when the solder paste inspection data, the component inspection data or the circuit inspection data indicates presence of defect, the analysis and calculation device intercepts the operating data, the equipment data, the raw material data, the process data and the environment data in correspondence to the manufacturing time of the pin location of the electronic component from the time data stream, so as to generate the data feature portrait, and the analysis and calculation device then sets the reliability value based on location association between the solder paste inspection data, the component inspection data, the circuit inspection data and the maintenance data in the location data stream, and the analysis and calculation device then performs similarity calculation on the data feature portrait and the comparison data feature portrait to calculate the similarity value, and then calculates the relative reliability value equal to the reliability value of the comparison data feature portrait times the similarity value plus the reliability value of the data feature portrait; the analysis and calculation device can compare the relative reliability value with the reliability threshold value, so as to generate maintenance suggestion information based on a comparison result.

Therefore, the technical solution of the present invention can solve the conventional technology problem of not easy to perform printing solder point quality identification and lacking targeted maintenance suggestions, so as to achieve the technical effect of providing accurate printing solder point quality identification and maintenance suggestions.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A printing solder point quality identification and maintenance suggestion system, adapted to an analysis and calculation device, and the printing solder point quality identification and maintenance suggestion system comprising:
    a solder paste printing workstation configured to provide an operating data, an equipment data, a raw material data, a process data and an environment data;
    a solder paste inspection configured to provide a solder paste inspection data;
    an automated optical inspection configured to provide a component inspection data;
    an in-line circuit inspection configured to provide a circuit inspection data;
    a maintenance workstation machine configured to provide a maintenance data, wherein the maintenance data in correspondence to the solder paste inspection data, the component inspection data and the circuit inspection data; and
    the analysis and calculation device comprising:
    a data receiving module configured to receive the operating data, the equipment data, the raw material data, the process data and the environment data from the solder paste printing workstation, receive the solder paste inspection data from the solder paste inspection, receive the component inspection data from the automated optical inspection, receive the circuit inspection data from the in-line circuit inspection, and receive the maintenance data from a maintenance workstation machine;
    a data integration module configured to associate and integrate the operating data, the equipment data, the raw material data, the process data and the environment data into a time data stream, based on time;
    a location mapping module configured to map a solder point location of the solder paste inspection data to a location of the electronic component of the component inspection data, and then map the location of the electronic component of the component inspection data to the pin location of the electronic component in the circuit inspection data and the maintenance data, so as to associate and integrate into a location data stream;
    a data acquisition module, wherein when the solder paste inspection data, the component inspection data or the circuit inspection data indicate defect, the data acquisition module intercepts the operating data, the equipment data, the raw material data, the process data and the environment data in correspondence to the manufacturing time of the pin location of the electronic component, from the time data stream;
    a data feature portrait module configured to perform data projection on the intercepted operating data, the intercepted equipment data, the intercepted raw material data, the intercepted process data and the intercepted environment data, to generate a data feature portrait;
    a reliability setting module configured to set a reliability value based on a location association between the solder paste inspection data, the component inspection data, the circuit inspection data and the maintenance data in the location data stream;
    a calculation module configured to perform similarity calculation on the data feature portrait and the comparison data feature portrait to calculate a similarity value, and calculate a relative reliability value equal to a reliability value of the comparison data feature portrait times the similarity value plus a reliability value of the data feature portrait; and
    a generation module configured to compare the relative reliability value and a reliability threshold value, so as to generate a maintenance suggestion information based on a comparison result.

2. The printing solder point quality identification and maintenance suggestion system according to claim 1, wherein when the solder paste inspection data indicates presence of defect, the reliability setting module sets the reliability value as a first reliability value;
    wherein when the solder paste inspection data indicates presence of defect and the location of the electronic component mapping to the component inspection data also indicates presence of defect, the reliability setting module sets the reliability value as a second reliability value;

wherein when the solder paste inspection data indicates presence of defect and the pin location of the electronic component mapping to the circuit inspection data also indicates presence of defect, the reliability setting module sets the reliability value as a third reliability value;

wherein when the solder paste inspection data indicates presence of defect and the location of the electronic component mapping to the component inspection data also indicates presence of defect and the pin location of the electronic component mapping to the circuit inspection data also indicates presence of defect, the reliability setting module sets the reliability value as a fourth reliability value;

wherein when the solder paste inspection data indicates presence of defect and the location of the electronic component mapping to the component inspection data indicates presence of defect and the pin location of the electronic component mapping to the circuit inspection data indicates presence of defect and the pin location of the electronic component mapping to the maintenance data presence of defect, the reliability setting module sets the reliability value as a fifth reliability value.

3. The printing solder point quality identification and maintenance suggestion system according to claim 1, wherein the calculation module performs the similarity calculation on the data feature portrait and the comparison data feature portrait to calculate the similarity value by calculating differences between data points in the data feature portrait and corresponding data points in the comparison data feature portrait, respectively, and multiplying the differences by weight values to obtain weighted differences, and then calculating an average of the weighted differences to obtain the similarity value.

* * * * *